(12) United States Patent
Chiou et al.

(10) Patent No.: US 6,921,282 B2
(45) Date of Patent: Jul. 26, 2005

(54) HANDLE ASSEMBLY FOR USE WITH REMOVABLE ELECTRONIC APPLIANCE

(75) Inventors: Chuang-Huan Chiou, Taoyuan Hsien (TW); Yuan-Sheng Chen, Taoyuan Hsien (TW)

(73) Assignee: Delta Electronics, Inc. (TW)

( * ) Notice: Subject to any disclaimer, the term of this patent is extended or adjusted under 35 U.S.C. 154(b) by 0 days.

(21) Appl. No.: 10/747,477

(22) Filed: Dec. 29, 2003

(65) Prior Publication Data

US 2005/0026464 A1 Feb. 3, 2005

(30) Foreign Application Priority Data

Aug. 1, 2003 (TW) ........................................ 92121238 A

(51) Int. Cl.[7] ............................................. H01R 13/00
(52) U.S. Cl. ...................................... 439/483; 439/484
(58) Field of Search .............................. 439/483, 476.1, 439/484; 312/232.1, 332.1

(56) References Cited

U.S. PATENT DOCUMENTS

| | | | | |
|---|---|---|---|---|
| 5,020,151 A | * | 5/1991 | Sampei et al. | .............. 455/345 |
| 5,216,904 A | * | 6/1993 | Isaki | .............................. 70/58 |
| 5,694,290 A | * | 12/1997 | Chang | ........................ 361/685 |
| 5,797,667 A | * | 8/1998 | Wu | ......................... 312/332.1 |
| 5,947,572 A | * | 9/1999 | Chang | ..................... 312/332.1 |
| 6,250,553 B1 | * | 6/2001 | Beseth et al. | ............... 235/487 |
| 6,820,953 B2 | * | 11/2004 | Wojcik | .................... 312/332.1 |

* cited by examiner

*Primary Examiner*—Phuong Dinh
(74) *Attorney, Agent, or Firm*—Madson & Metcalf

(57) ABSTRACT

A handle assembly for use with a removable electronic appliance includes a rotating shaft, a plate, a handle and a resilience sheet. The rotating shaft has one end fixed on a surface of a housing of the removable electronic appliance. The plate is disposed on the surface of the housing and pivoted about the rotating shaft. The handle is coupled to the plate. The resilience sheet is fixed on the surface of the housing, wherein an elastic force is stored therein when the handle is urged against the resilience sheet, and the handle is spontaneously pulled out of the housing when the handle is detached from the resilience sheet.

18 Claims, 11 Drawing Sheets

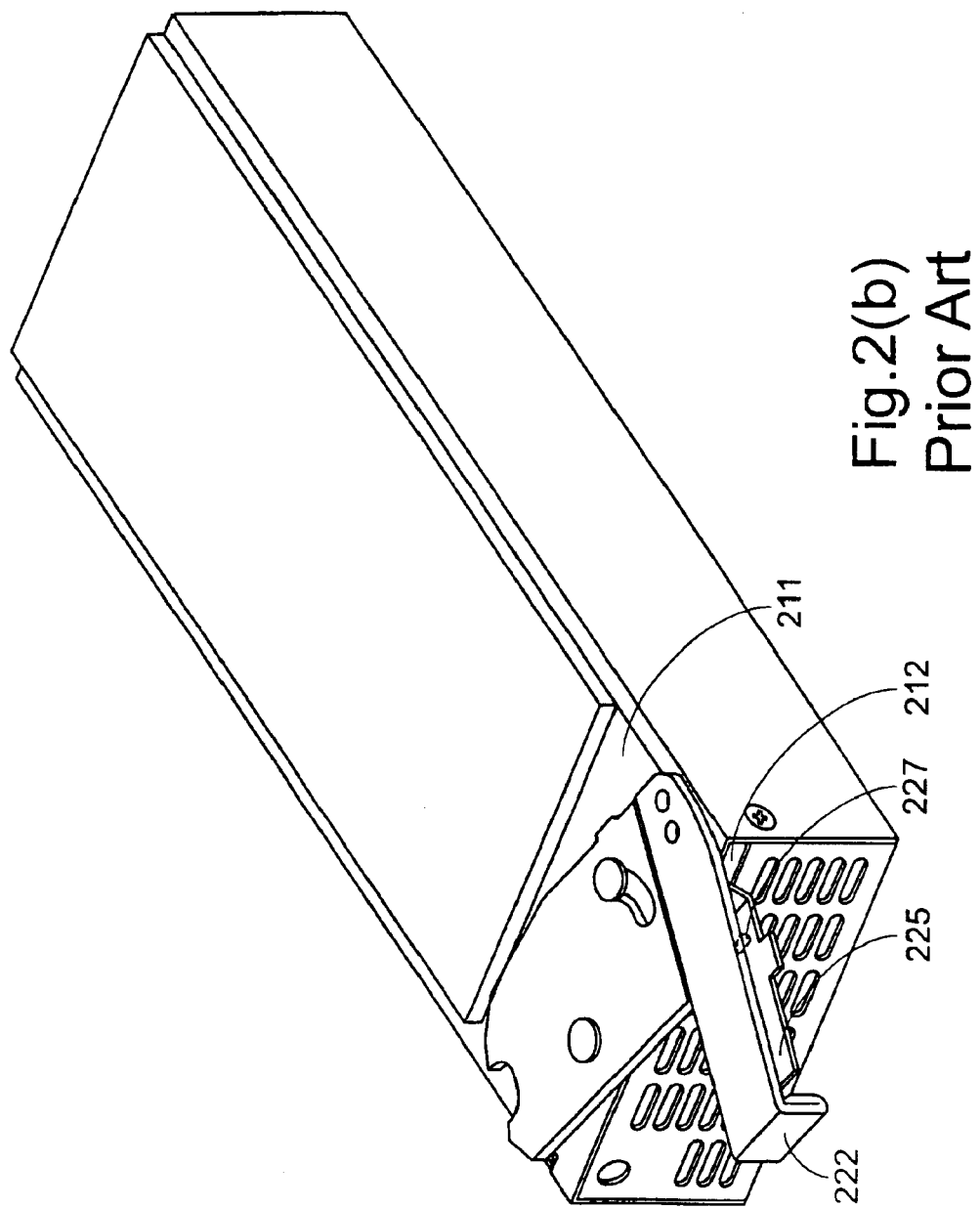

HANDLE ASSEMBLY FOR USE WITH REMOVABLE ELECTRONIC APPLIANCE

FIELD OF THE INVENTION

The present invention relates to a handle assembly, and more particularly to a handle assembly for use with a removable electronic appliance.

BACKGROUND OF THE INVENTION

Nowadays, removable electronic appliances, such as removable power supply apparatuses or removable hard discs, are widely used in industrial computers, servers, disk raids, communication apparatuses, etc. The power supply apparatus can provide sufficient and continuous power, and the removable hard disc has sufficient and easily managed information storage space. The removable electronic appliances are advantageous for avoiding inconvenience of frequently pulling out the power supply apparatuses or the hard discs because they are hot swappable.

Take a removable power supply apparatus for example. In order to conveniently pull out respective power supply apparatus for checking and repairing the components therein, the power supply apparatus typically has a handle mounted on a housing thereof. Referring to FIG. 1, a conventional removable power supply apparatus comprises a housing 11, a handle 12 fixed on a surface 13 of the housing 11 and a circuit board (not shown) within the housing 11. The handle 12 is securely held and accessible for a user to pull the appliance. However, since the handle 12 is fixed on the housing 11, the handle 12 fails to be stored and thus wastes space.

Referring to FIGS. 2(a) and 2(b), another removable power supply apparatus having a handle assembly is shown. In FIG. 2(a), the removable power supply apparatus comprises a housing 21, a handle assembly 22 having one end coupled to a surface 211 of the housing 21 and a circuit board (not shown) within the housing 21. The handle assembly 22 comprises a plate 221, a handle 222, a rotating shaft 223, a retaining shaft 224 and a resilience sheet 225. The plate 221 and the handle 222 are integrally formed. Each of the rotating shaft 223 and the retaining shaft 224 has one end (not shown) fixed on the surface 211 of the housing 21. The other end of the rotating shaft 223 penetrates through the plate 221. The plate 221 can be pivoted about the rotating shaft 223. The other end of the retaining shaft 224 moves along a track 226 in the plate 221 between a first position 2261 and a second position 2262. In such configuration, when the plate 221 is pivoted about the rotating shaft 223, the handle 222 is switched in either a stored state or a pulled state. One end of the resilience sheet 225 is coupled to the bottom of the handle 222. The other end of the resilience sheet 225 is distant from the handle 222 and comprises a protrusion 227. The housing 21 further comprises an opening 212. When the handle 222 is in the stored state, the protrusion 227 of the resilience sheet 225 will be urged against the inner wall of the periphery of the opening 212. Therefore, the length and area of the handle 222 extending the housing 21 is shortened.

When the removable power supply apparatus is to be pulled out, the resilience sheet 225 should be firstly pressed down by the forefinger so as to release the protrusion 227 of the resilience sheet 225 from the inner wall of the periphery of the opening 212. Then, a slight pulling force is required to pull the handle 222 toward the user. Accordingly, the handle 222 will drive the plate 221 to pivot about the rotating shaft 223, and the retaining shaft 224 moves along the track 226 from the first position 2261 to the second position 2262 such that the handle 222 is in the pulled state. Meanwhile, the handle 222 has a relatively large force-receiving area and a relatively long force-receiving arm, which is advantageous for pulling the removable power supply apparatus with a low force.

However, the handle assembly shown in FIGS. 2(a) and 2(b) has some drawbacks. For example, since the handle 222 should be extended from the housing 21 to provide a space for the forefinger to press down the resilience sheet 225, the handle 2 still occupies some space outside the housing 21 when stored. In addition, a slight pulling force is required to pull the handle 222 toward the user when the handle 222 is in the pulled state.

SUMMARY OF THE INVENTION

It is an object of the present invention to provide a handle assembly for use with a removable electronic appliance, in which the handle assembly is spontaneously pulled out of the system so as to facilitate checking and repairing the components therein.

In accordance with an aspect of the present invention, there is provided a handle assembly for use with a removable electronic appliance. The removable electronic appliance comprises a housing and a handle assembly having one end coupled to a surface of the housing. The handle assembly comprises a rotating shaft, a plate, a handle and a resilience sheet. The rotating shaft has one end fixed on the surface of the housing. The plate is disposed on the surface of the housing and pivoted about the rotating shaft. The handle is coupled to the plate. The resilience sheet is fixed on the surface of the housing, wherein an elastic force is stored therein when the handle is urged against the resilience sheet, and the handle is spontaneously pulled out of the housing when the handle is detached from the resilience sheet.

In an embodiment, the handle assembly further comprises a retaining shaft having one end fixed on the surface of the housing.

In an embodiment, the other end of the retaining shaft moves along a track in the plate between a first position and a second position.

In an embodiment, the handle comprises a protrusion.

In an embodiment, the resilience sheet comprises a press portion, a hollow portion and an extension piece. The extension piece extends downward into the hollow portion, and has a free end bent upright and penetrating through the hollow portion so as to form a bend portion at the free end thereof.

In an embodiment, when the rear edge of the handle is urged against the bend portion of the resilience sheet, and the protrusion of the handle is engaged with the periphery of the hollow portion, the handle is held in a stored state.

In an embodiment, the retaining shaft moves along the track from the second position to the first position, when the handle is held in the stored state.

In an embodiment, the press portion of the resilience sheet is pressed down to release the engagement of the protrusion of the handle and the hollow portion of the resilience sheet such that the handle is spontaneously pulled out from the housing in a pulled state due to the release of the elastic force stored in the bend portion of the resilience sheet.

In an embodiment, the retaining shaft moves along the track from the first position to the second position, when the handle is held in the pulled state.

In an embodiment, the handle further comprises a retaining hole. The resilience sheet comprises a press portion, a hollow portion, a protruding portion in the vicinity of the hollow portion, and an extension piece. The extension piece extends downward into the hollow portion, and has a free end bent upright and penetrating through the hollow portion so as to form a bend portion at the free end thereof.

In an embodiment, when the rear edge of the handle is urged against the bend portion of the resilience sheet, and the retaining hole of the handle is engaged with the protruding portion of the resilience sheet, the handle is held in a stored state.

In an embodiment, the press portion of the resilience sheet is pressed down to release the engagement of the retaining hole of the handle and the protruding portion of the resilience sheet such that the handle is spontaneously pulled out from the housing in a pulled state due to the release of the elastic force stored in the bend portion of the resilience sheet.

In an embodiment, the plate and handle are integrally formed.

In an embodiment, the rotating shaft has one end fixed on the surface of the housing and the other end penetrating through the plate, thereby allowing the plate to be pivoted about the rotating shaft.

In an embodiment, one end of the resilience sheet is coupled to the surface of the housing by means of soldering or a tenon.

The above objects and advantages of the present invention will become more readily apparent to those ordinarily skilled in the art after reviewing the following detailed description and accompanying drawings, in which:

BRIEF DESCRIPTION OF THE DRAWINGS

FIGS. 2(a) and 2(b) are perspective views of another conventional removable power supply apparatus having a handle assembly in a stored and a pulled states, respectively;

DETAILED DESCRIPTION OF THE PREFERRED EMBODIMENT

The present invention relates to a handle assembly. The present invention will now be described more specifically with reference to the following embodiments relating to a handle assembly for use with a power supply apparatus. However, the following descriptions of preferred embodiments of this invention are presented herein for purpose of illustration and description only; it is not intended to be exhaustive or to be limited to the precise form disclosed. For example, the concept of the present invention can be applied to a handle assembly for use with a removable disk raid.

Figure 3:
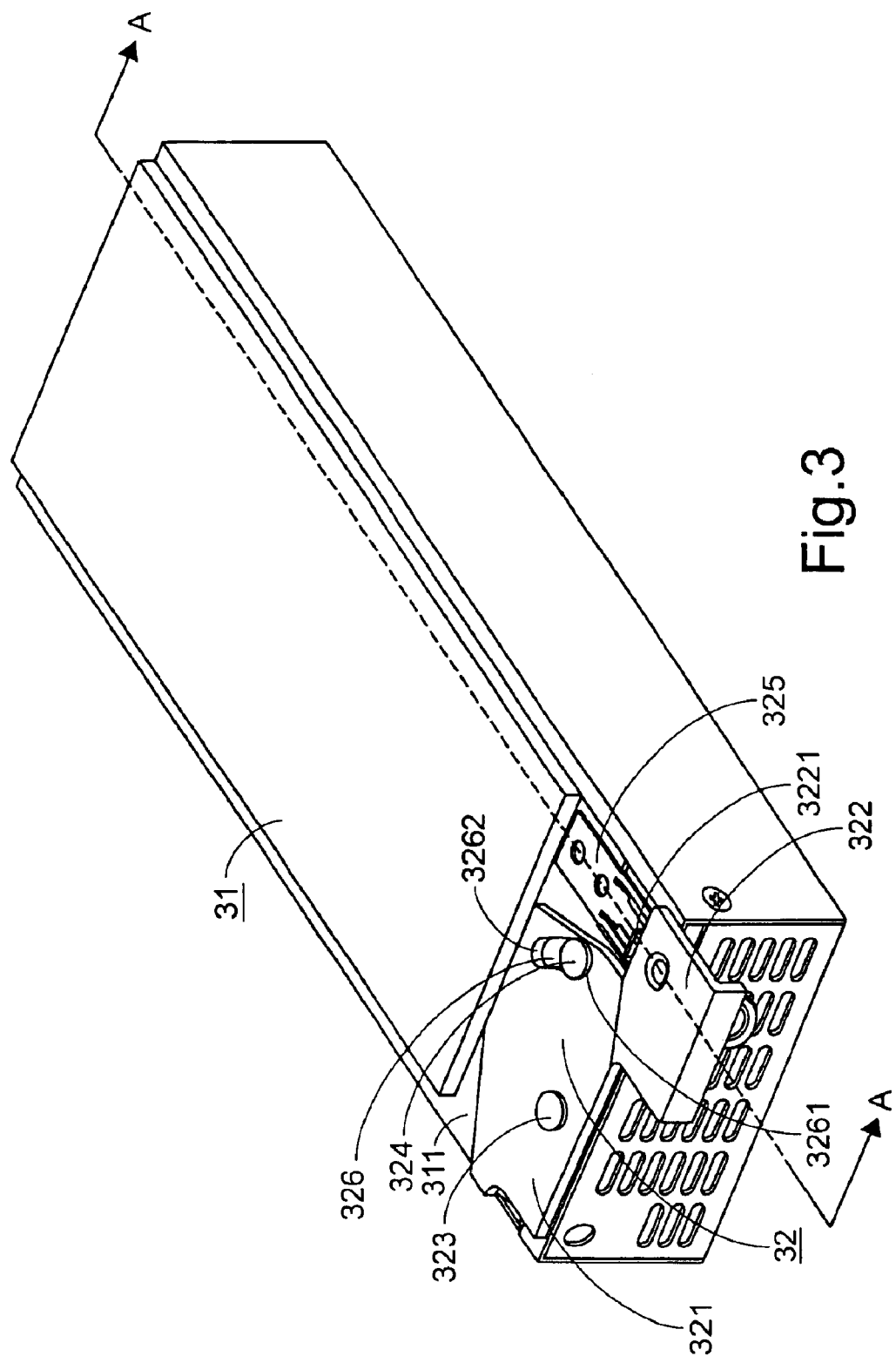
FIG. 3 is a perspective view of a removable power supply apparatus having a handle assembly according to a preferred embodiment of the present invention.

Referring to FIG. 3, a removable power supply apparatus according to a first embodiment of the present invention is shown. The removable power supply apparatus comprises a housing 31, a handle assembly 32 having one end coupled to a surface 311 of the housing 31 and a circuit board (not shown) within the housing 31. The handle assembly 32 comprises a plate 321, a handle 322, a rotating shaft 323, a retaining shaft 324 and a resilience sheet 325. The plate 321 and the handle 322 are integrally formed. Each of the rotating shaft 323 and the retaining shaft 324 has one end (not shown) fixed on the surface 311 of the housing 31. The other end of the rotating shaft 323 penetrates through the plate 321. The plate 321 can be pivoted about the rotating shaft 323. The other end of the retaining shaft 324 moves along a track 326 in the plate 321 between a first position 3261 and a second position 3262. In such configuration, when the plate 321 is pivoted about the rotating shaft 323, the handle 322 is switched in either a stored state or a pulled state. One end of the resilience sheet 325 is fixed on the surface 311 of the housing 31. The other end of the resilience sheet 325 extends under the bottom of the handle 322.

Figure 4:
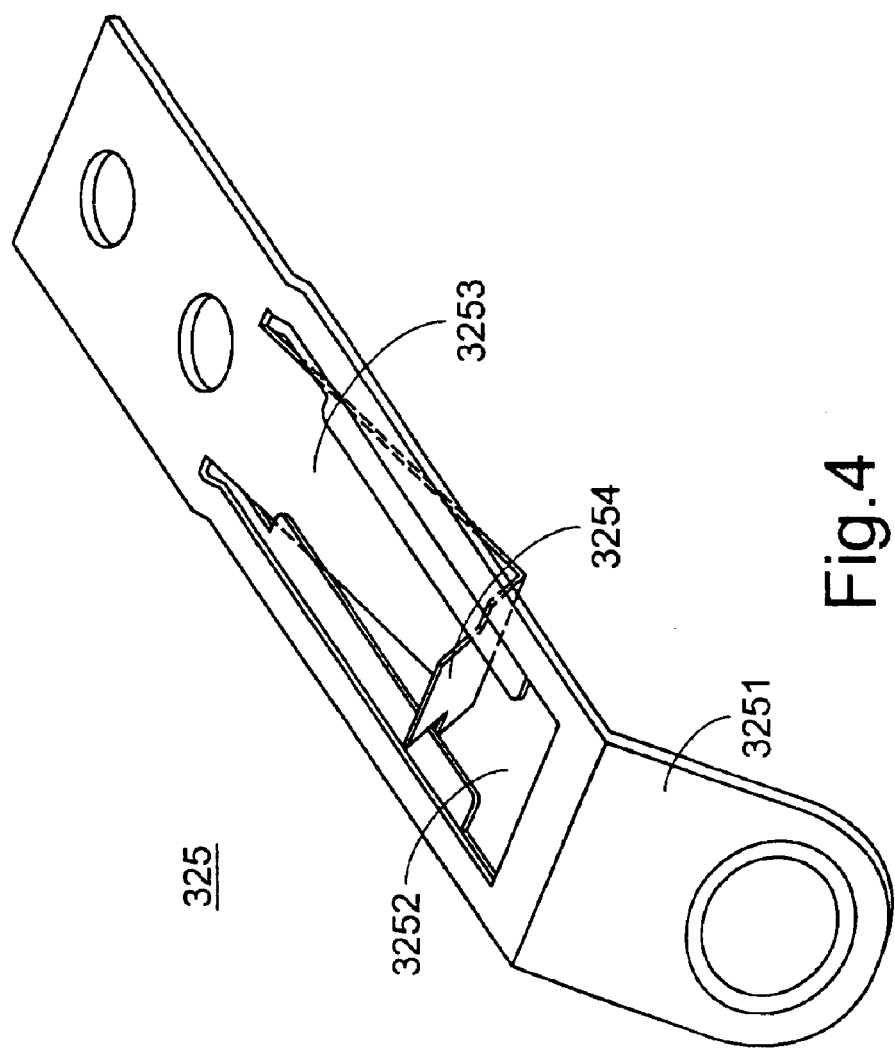
FIG. 4 is a schematic view of a resilience sheet used in the handle assembly of FIG. 3.

The detailed structure of the resilience sheet 325 is shown in FIG. 4. The resilience sheet 325 comprises a press portion 3251, a hollow portion 3252 and an extension piece 3253. One end of the resilience sheet 325 is coupled to the surface 311 of the housing 31 by means of soldering or a tenon. The extension piece 3253 extends downward into the hollow portion 3252. The free end of the extension piece 3253 is bent upright and penetrates through the hollow portion 3252 so as to form a bend portion 3254 at the free end thereof.

The operation principles of the above handle assembly will be described in more details with reference to FIGS. 3~6.

Figure 5:
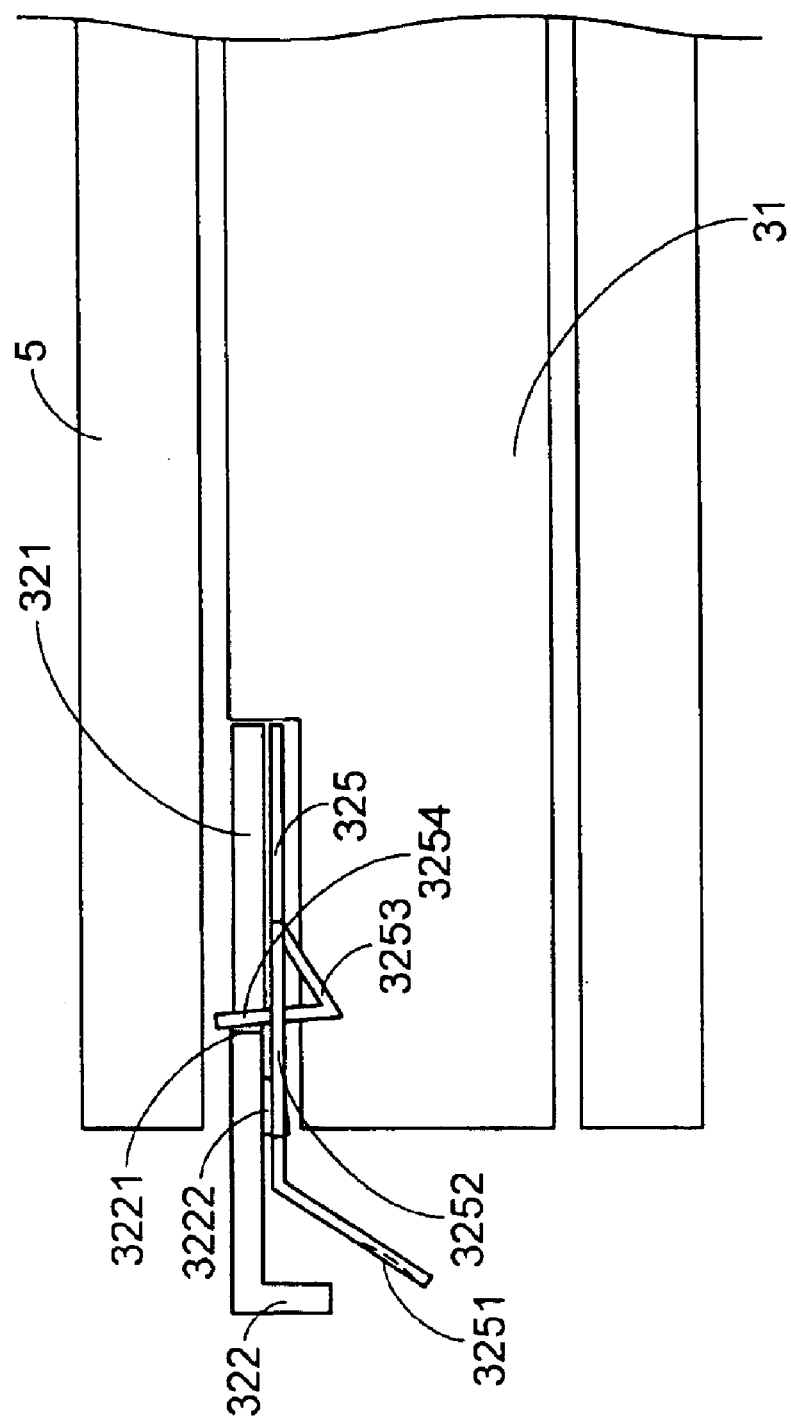
FIG. 5 is a cross-sectional view of the handle assembly in FIG. 3 along line A—A in the stored state.

When the removable power supply apparatus is to be mounted onto the system 5, i.e. in a stored state, an external force is applied to the handle 322 so as to drive the plate 321 to pivot about the rotating shaft 323, and thus the retaining shaft 324 moves along the track 326 from the second position 3262 to the first position 3261. Meanwhile, the rear edge 3221 of the handle 322 is urged against the bend portion 3254 of the resilience sheet 325, and the protrusion 3222 at the bottom of handle 322 is engaged with the periphery of the hollow portion 3252, such that the handle 322 is held in the stored state, as shown in FIG. 5.

Figure 6:
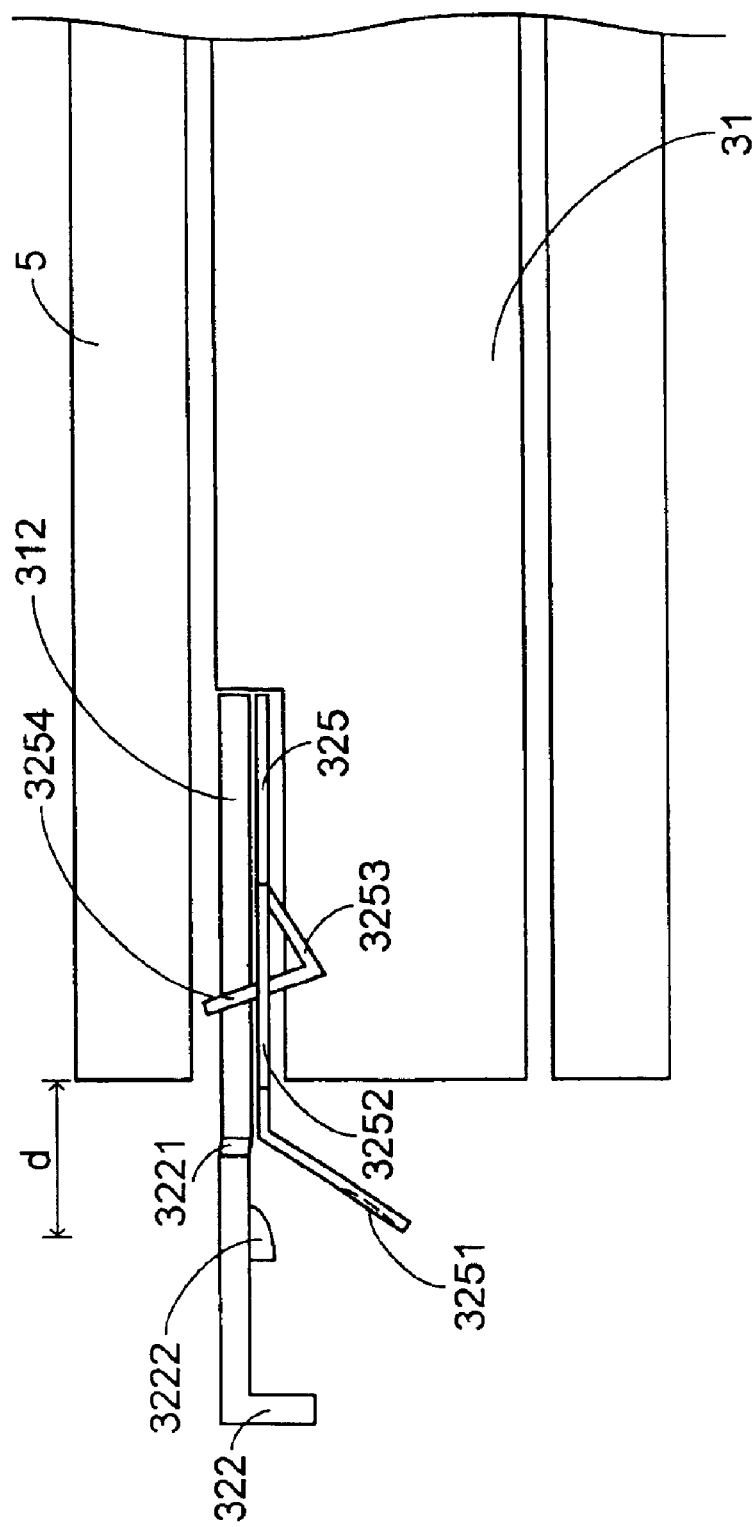
FIG. 6 is a cross-sectional view of the handle assembly in FIG. 3 along line A—A in the pulled state.

When the removable power supply apparatus is to be pulled out, the press portion 3251 of the resilience sheet 325 should be firstly pressed down to release the engagement of the protrusion 3222 and the hollow portion 3252. Meanwhile, due to the release of the elastic force stored in the bend portion 3254 of the resilience sheet 325, the handle 322 is spontaneously pulled out of the system 5 at a distance of d. During the handle 322 is pulled out of the system 5, the handle 322 will drive the plate 321 to pivot about the rotating shaft 323, and the retaining shaft 324 moves along the track 326 from the first position 3261 to the second position 3262 such that the handle 322 is in the pulled state, as is shown in FIG. 6. Accordingly, the handle 322 has a relatively large force-receiving area and a relatively long force-receiving arm for pulling the removable power supply apparatus.

Figure 7:
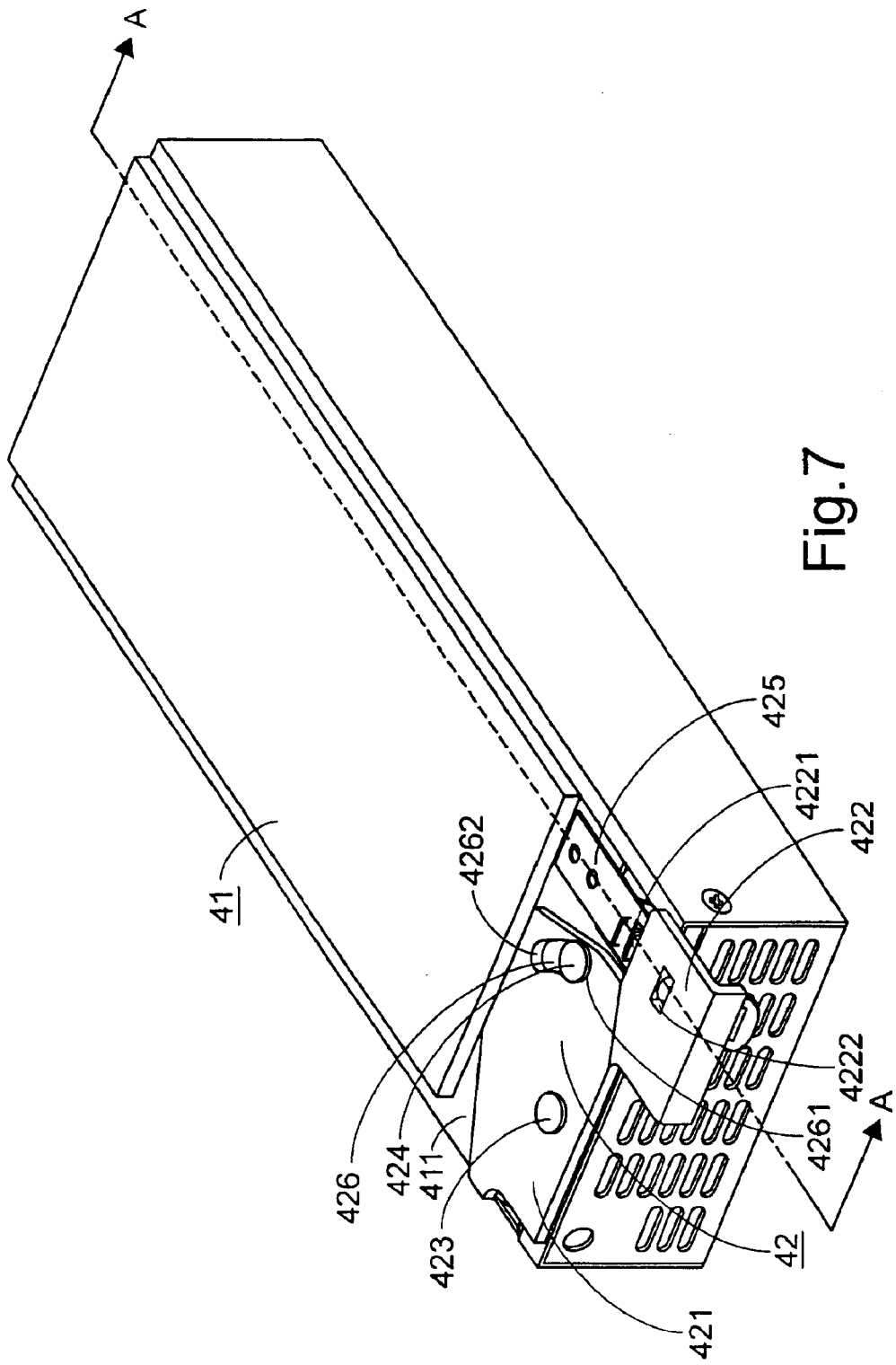
FIG. 7 is a perspective view of a removable power supply apparatus having a handle assembly according to another preferred embodiment of the present invention.

Referring to FIG. 7, a removable power supply apparatus according to a second embodiment of the present invention is shown. The removable power supply apparatus comprises a housing 41, a handle assembly 42 having one end coupled to a surface 411 of the housing 41 and a circuit board (not shown) within the housing 41. The handle assembly 42 comprises a plate 421, a handle 422, a rotating shaft 423, a retaining shaft 424 and a resilience sheet 425. The plate 421 and the handle 422 are integrally formed. Each of the rotating shaft 423 and the retaining shaft 424 has one end (not shown) fixed on the surface 411 of the housing 41. The other end of the rotating shaft 423 penetrates through the plate 421. The plate 421 can be pivoted about the rotating shaft 423. The other end of the retaining shaft 424 moves along a track 426 in the plate 421 between a first position 4261 and a second position 4262. In such configuration, when the plate 421 is pivoted about the rotating shaft 423, the handle 422 is switched in either a stored state or a pulled state. One end of the resilience sheet 425 is fixed on the surface 411 of the housing 41. The other end of the resilience sheet 425 extends under the bottom of the handle 422.

Figure 8:
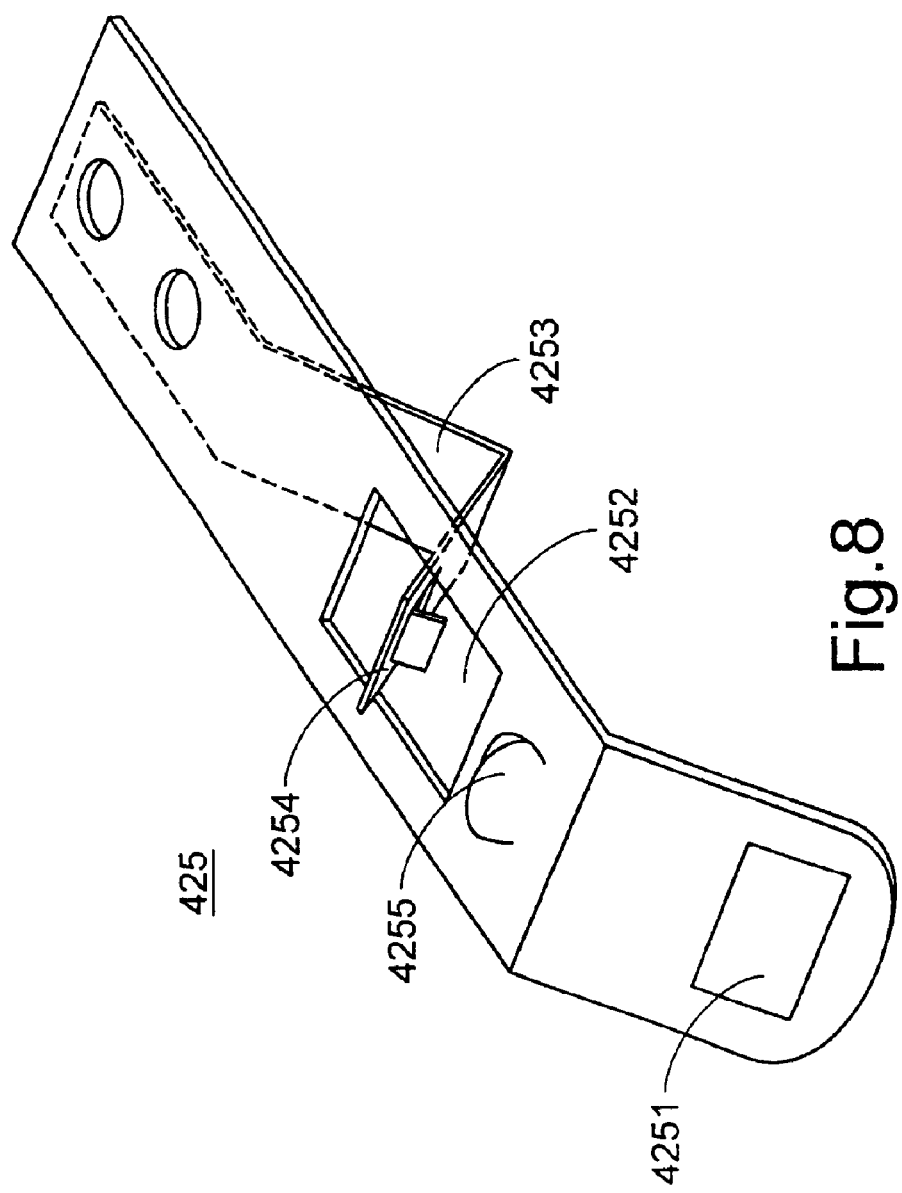
FIG. 8 is a schematic view of a resilience sheet used in the handle assembly of FIG. 7.

The detailed structure of the resilience sheet 425 is shown in FIG. 8. The resilience sheet 425 comprises a press portion 4251, a hollow portion 4252 and an extension piece 4253. One end of the resilience sheet 425 is coupled to the surface 411 of the housing 41 by means of soldering or a tenon. One end of the extension piece 4253 extends downward into the hollow portion 4252. The free end of the extension piece 4253 is bent upright and penetrates through the hollow portion 4252 so as to form a bend portion 4254 at the free end thereof. The resilience sheet 425 further comprises a protruding portion 4255 in the vicinity of the hollow portion 4252.

The operation principles of the above handle assembly will be described in more details with reference to FIGS. 7~10.

Figure 9:
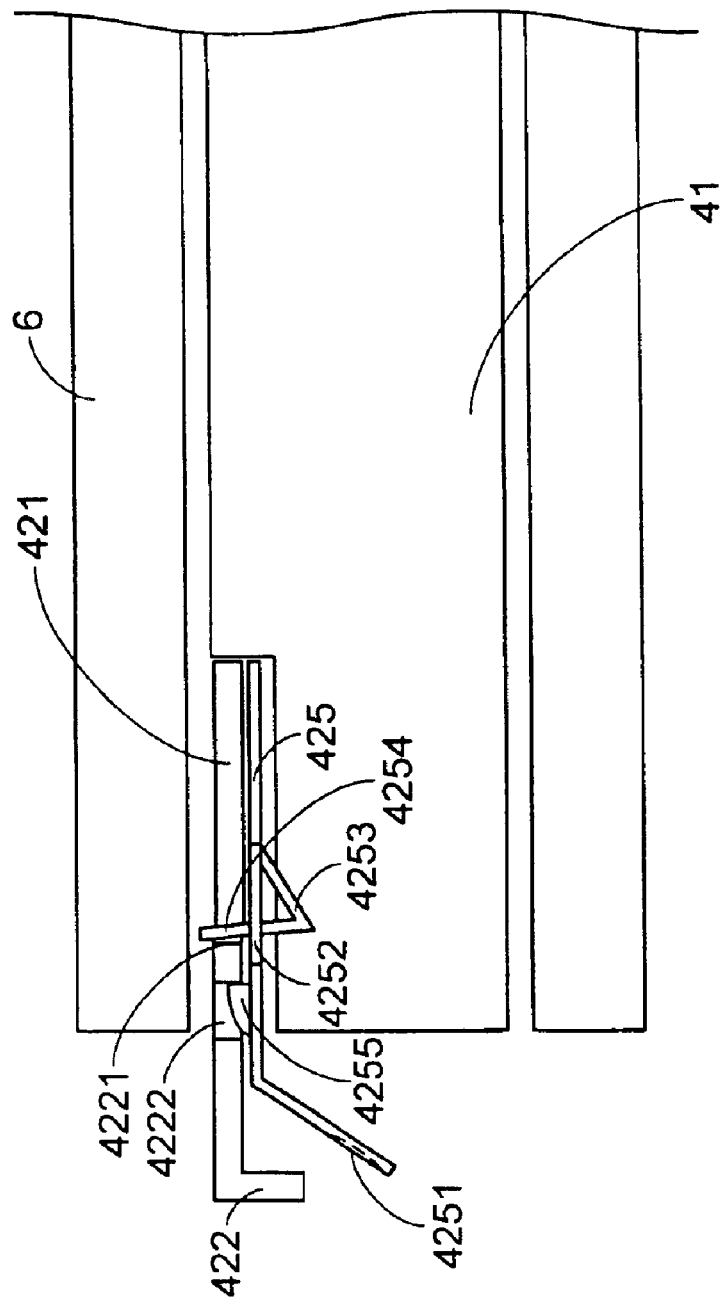
FIG. 9 is a cross-sectional view of the handle assembly in FIG. 7 along line A—A in the stored state.

When the removable power supply apparatus is to be mounted onto the system 6, i.e. in a stored state, an external force is applied to the handle 422 so as to drive the plate 421 to pivot about the rotating shaft 423, and thus the retaining shaft 424 moves along the track 426 from the second position 4262 to the first position 4261. Meanwhile, the rear edge 4221 of the handle 422 is urged against the bend portion 4254 of the resilience sheet 425, and the retaining hole 4222 of handle 422 is engaged with the protruding portion 4255 of the resilience sheet 425, such that the handle 422 is held in the stored state, as shown in FIG. 9.

Figure 10:
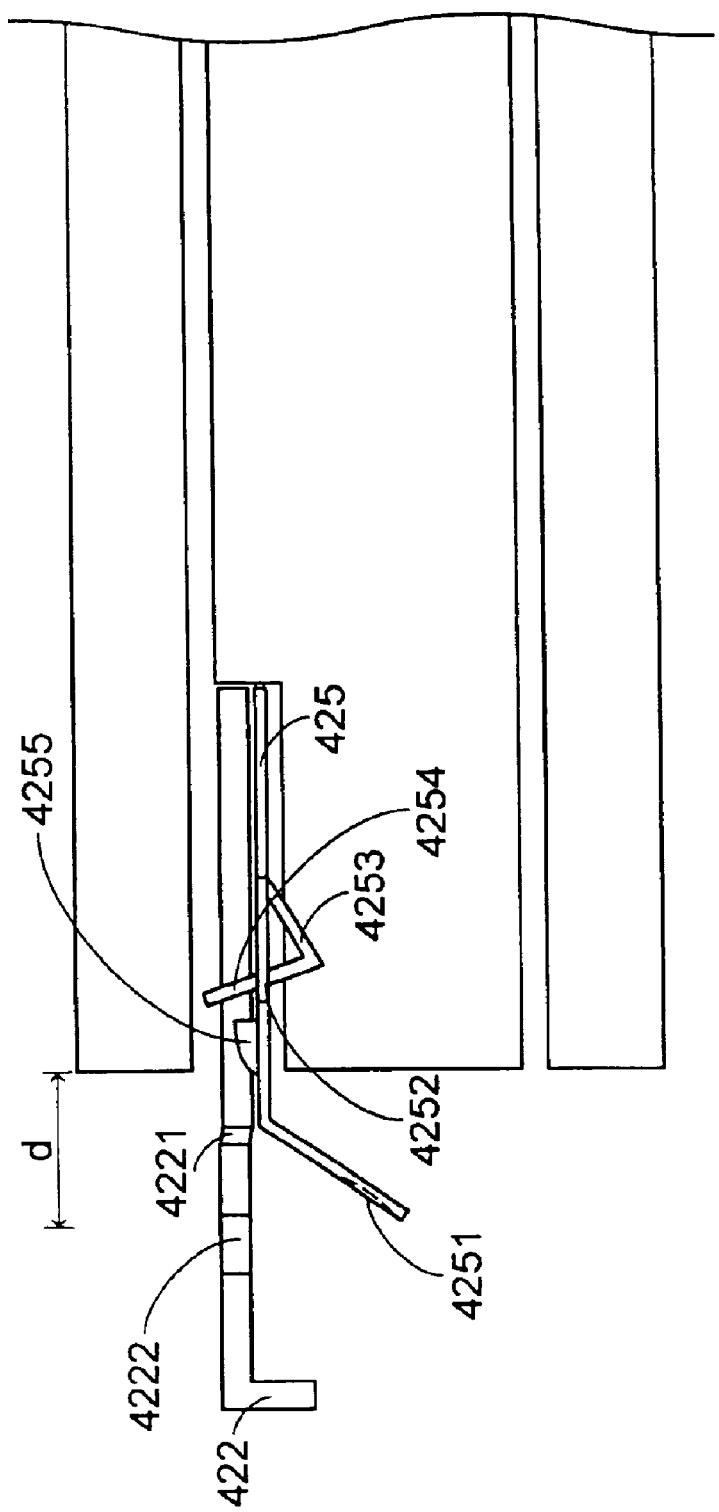
FIG. 10 is a cross-sectional view of the handle assembly in FIG. 7 along line A—A in the pulled state.

When the removable power supply apparatus is to be pulled out, the press portion 4251 of the resilience sheet 425 should be firstly pressed down to release the engagement of the retaining hole 4222 and the protruding portion 4255. Meanwhile, due to the release of the elastic force stored in the bend portion 4254 of the resilience sheet 425, the handle 422 is spontaneously pulled out of the system 6 at a distance of d. During the handle 422 is pulled out of the system 6, the handle 422 will drive the plate 421 to pivot about the rotating shaft 423, and the retaining shaft 424 moves along the track 426 from the first position 4261 to the second position 4262 such that the handle 422 is in the pulled state, as is shown in FIG. 10. Accordingly, the handle 422 has a relatively large force-receiving area and a relatively long force-receiving arm for pulling the removable power supply apparatus.

Figure 1:
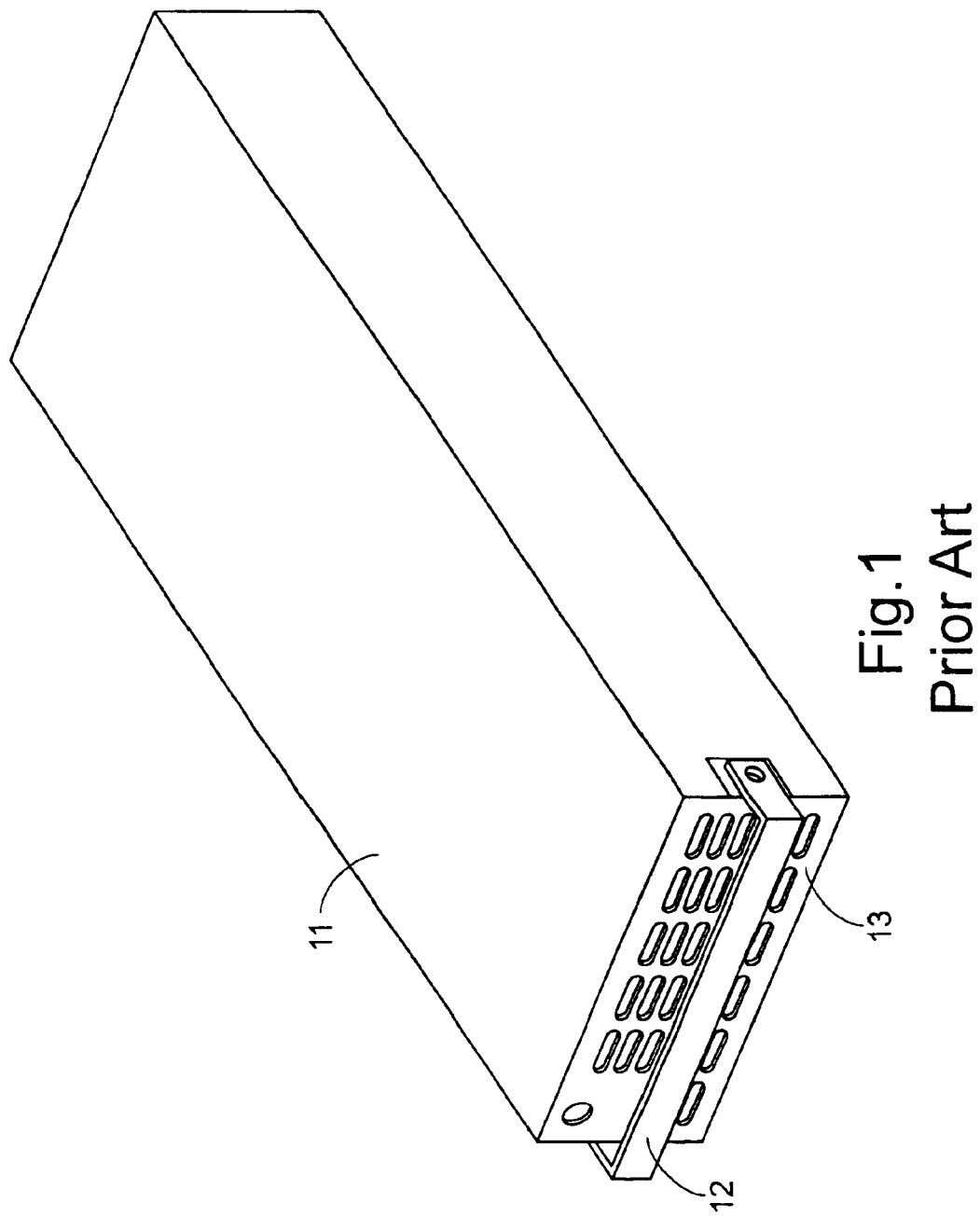
FIG. 1 is a perspective view of a conventional removable power supply apparatus having a handle assembly.
Figure 2A:
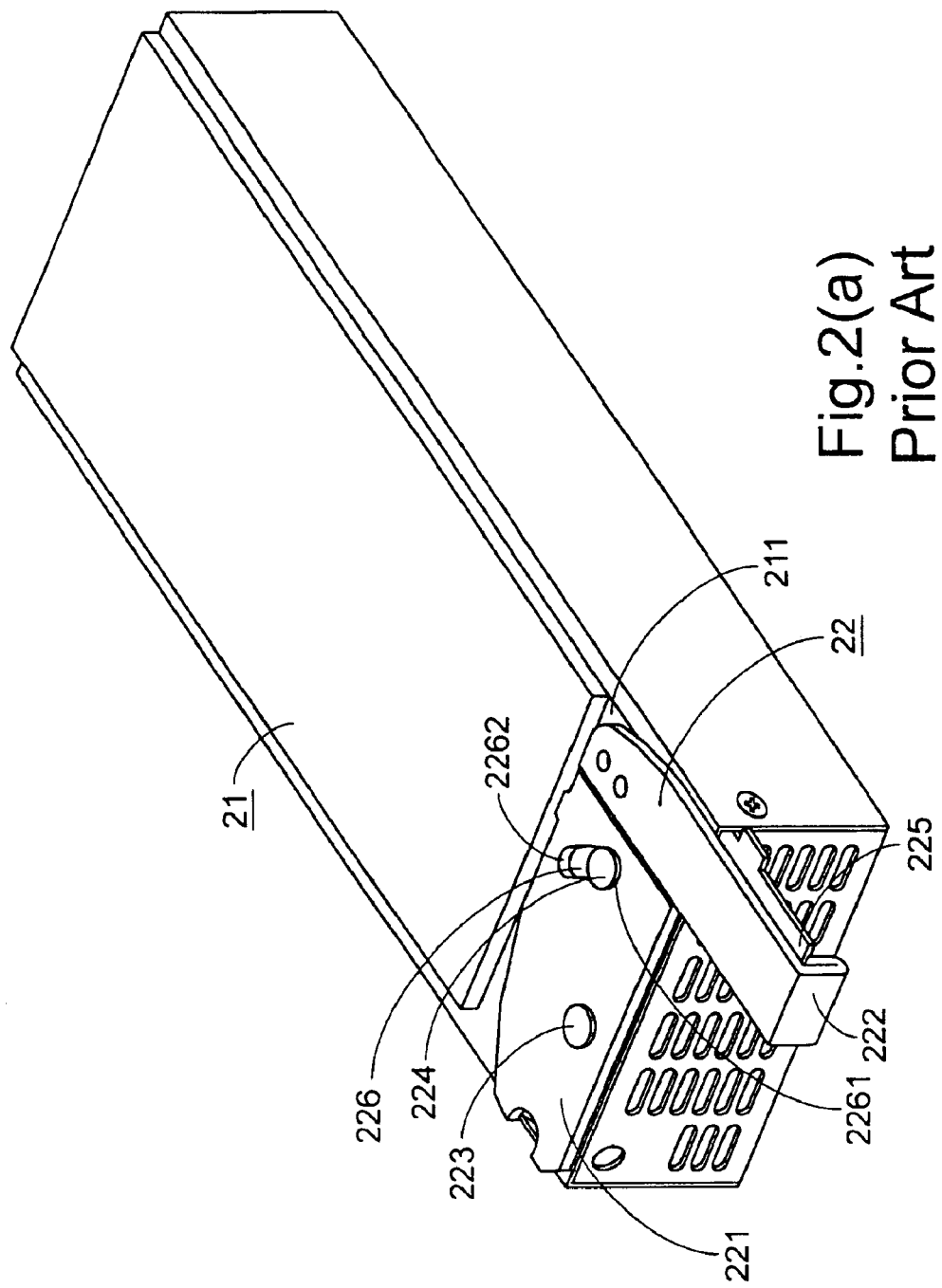

From the above description, it is understood that handle assembly of the present invention can be easily operated due to the specific designs of the resilience sheet and the handle. Since the handle is spontaneously pulled out of the system, a large area is obtained for grasping the handle of the removable electronic appliance. On the other hand, when the handle is held in the stored state, the length of the handle is reduced compared to the case shown in FIG. 2(a).

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A handle assembly for use with a removable electronic appliance, said removable electronic appliance comprising a housing and said handle assembly having one end coupled to a surface of said housing, said handle assembly comprising:
    a rotating shaft having one end fixed on said surface of said housing;
    a plate disposed on said surface of said housing and pivoted about said rotating shaft;
    a handle coupled to said plate; and
    a resilience sheet fixed on said surface of said housing, wherein an elastic force is stored therein when said handle is urged against said resilience sheet, and said handle is spontaneously pulled out of said housing when said handle is detached from said resilience sheet.

2. The handle assembly according to claim 1 further comprising a retaining shaft having one end fixed on said surface of said housing.

3. The handle assembly according to claim 2 wherein the other end of said retaining shaft moves along a track in said plate between a first position and a second position.

4. The handle assembly according to claim 3 wherein said handle comprises a protrusion.

5. The handle assembly according to claim 4 wherein said resilience sheet comprises:
    a press portion;
    a hollow portion, and
    an extension piece extending downward into said hollow portion, and having a free end bent upright and penetrating through said hollow portion so as to form a bend portion at said free end thereof.

6. The handle assembly according to claim 5 wherein when a rear edge of said handle is urged against said bend portion of said resilience sheet, and the protrusion of said handle is engaged with the periphery of said hollow portion, said handle is held in a stored state.

7. The handle assembly according to claim 6 wherein said retaining shaft moves along said track from said second position to said first position, when said handle is held in said stored state.

8. The handle assembly according to claim 5 wherein said press portion of said resilience sheet is pressed down to release the engagement of said protrusion of said handle and said hollow portion of said resilience sheet such that said handle is spontaneously pulled out from said housing in a pulled state due to the release of the elastic force stored in said bend portion of said resilience sheet.

9. The handle assembly according to claim 8 wherein said retaining shaft moves along said track from said first position to said second position, when said handle is held in said pulled state.

10. The handle assembly according to claim 3 wherein said handle further comprises a retaining hole.

11. The handle assembly according to claim 10 wherein said resilience sheet comprises:
- a press portion;
- a hollow portion;
- a protruding portion in the vicinity of said hollow portion; and
- an extension piece extending downward into said hollow portion, and having a free end bent upright and penetrating through said hollow portion so as to form a bend portion at said free end thereof.

12. The handle assembly according to claim 10 wherein when a rear edge of said handle is urged against said bend portion of said resilience sheet, and said retaining hole of said handle is engaged with said protruding portion of said resilience sheet, said handle is held in a stored state.

13. The handle assembly according to claim 12 wherein said retaining shaft moves along said track from said second position to said first position, when said handle is held in said stored state.

14. The handle assembly according to claim 10 wherein said press portion of said resilience sheet is pressed down to release the engagement of said retaining hole of said handle and said protruding portion of said resilience sheet such that said handle is spontaneously pulled out from said housing in a pulled state due to the release of the elastic force stored in said bend portion of said resilience sheet.

15. The handle assembly according to claim 14 wherein said retaining shaft moves along said track from said first position to said second position, when said handle is held in said pulled state.

16. The handle assembly according to claim 1 wherein said plate and handle are integrally formed.

17. The handle assembly according to claim 1 wherein said rotating shaft has one end fixed on said surface of said housing and the other end penetrating through said plate, thereby allowing said plate to be pivoted about said rotating shaft.

18. The handle assembly according to claim 1 wherein one end of said resilience sheet is coupled to said surface of said housing by means of soldering or a tenon.

* * * * *